United States Patent
Giebeler et al.

(10) Patent No.: US 10,001,840 B2
(45) Date of Patent: Jun. 19, 2018

(54) SWITCH OPERATING DEVICE, MOBILE DEVICE AND METHOD FOR OPERATING A SWITCH BY A NON-TACTILE PUSH-GESTURE

(71) Applicant: Pyreos Ltd., Edinburgh (GB)

(72) Inventors: Carsten Giebeler, Edinburgh (GB); Spyros Brown, Edinburgh (GB); Tim Chamberlain, Edinburgh (GB); Jonathan Ephraim David Hurwitz, Edinburgh (GB)

(73) Assignee: Pyreos Ltd., Edinburgh (GB)

( * ) Notice: Subject to any disclaimer, the term of this patent is extended or adjusted under 35 U.S.C. 154(b) by 0 days. days.

(21) Appl. No.: 14/950,036

(22) Filed: Nov. 24, 2015

(65) Prior Publication Data

US 2016/0154467 A1 Jun. 2, 2016

Related U.S. Application Data

(63) Continuation of application No. PCT/EP2014/060549, filed on May 22, 2014.
(Continued)

(51) Int. Cl.
*G06F 3/01* (2006.01)
*H03K 17/945* (2006.01)
(Continued)

(52) U.S. Cl.
CPC ............ *G06F 3/017* (2013.01); *G06F 3/012* (2013.01); *G06F 3/0308* (2013.01); *G06F 3/041* (2013.01); *H03K 17/945* (2013.01)

(58) Field of Classification Search
None
See application file for complete search history.

(56) References Cited

U.S. PATENT DOCUMENTS

2008/0266083 A1  10/2008  Midholt et al.
2010/0204953 A1   8/2010  Onishi et al.
(Continued)

FOREIGN PATENT DOCUMENTS

JP   S61-13816 A    1/1986
JP   2001-235552 A  8/2001
(Continued)

OTHER PUBLICATIONS

International Search Report in counterpart International Application No. PCT/EP2014/060549, dated Aug. 8, 2014.
(Continued)

*Primary Examiner* — Kenneth B Lee, Jr.
(74) *Attorney, Agent, or Firm* — Edell, Shapiro & Finnan, LLC

(57) ABSTRACT

Switch operating device (100) with: a gesture sensor operating a switch (103) with a non-tactile push-gesture performed with a heat emitting part. The gesture has an approach phase (111) during which the part approaches the sensor, a waiting phase (113) during which the part remains proximate to the sensor, and a withdrawal phase (112) during which the part is moved away from the sensor. The sensor detects heat emitted by the part with at least one pixel and outputs per pixel a signal (51 to 54) with signal deflections (56, 57) corresponding to a temporal intensity curve of heat detected by the pixel while the gesture (115) is performed. A signal processing unit (101) which determines performance of the gesture from a temporal succession of signal deflections. An actuator (104) is controlled by the signal processing unit and operates the switch when the gesture is performed.

20 Claims, 3 Drawing Sheets

Related U.S. Application Data

(60) Provisional application No. 61/827,108, filed on May 24, 2013.

(51) Int. Cl.
   *G06F 3/03*  (2006.01)
   *G06F 3/041* (2006.01)

(56) References Cited

U.S. PATENT DOCUMENTS

2010/0295773 A1* 11/2010 Alameh ............ H03K 17/9631
                                             345/156
2011/0050643 A1    3/2011 Zhao et al.

FOREIGN PATENT DOCUMENTS

| JP | 2008232715 A | 10/2008 |
|----|--------------|---------|
| JP | 2009134761 A | 6/2009 |
| JP | 2009-223490 A | 10/2009 |
| JP | 2010015204 A | 1/2010 |

OTHER PUBLICATIONS

Cheng, H. et al., "Contactless Gesture Recognition System . . . ", Consumer Electronics (ICCE), 2011 IEEE, Jan. 9, 2011, pp. 149-150, XP031921157.

Wojtczuk, P. et al., "Recognition of Simple Gestures Using a PIR Sensor Array", Sensors & Transducers, International Frequency Sensor Association, CA, vol. 14, No. 1, Mar. 12, 2012, pp. 83-94, XP002714652.

Kim, Y.S. et al., "A motion gesture sensor using photodiodes with limited field-of-view", Optics Express, vol. 21, No. 8, 22, 2013, p. 9206, XP055090605.

Office Action in corresponding Japanese Application 2016514412, dated Jan. 29, 2018, along with English Translation.

\* cited by examiner

SWITCH OPERATING DEVICE, MOBILE DEVICE AND METHOD FOR OPERATING A SWITCH BY A NON-TACTILE PUSH-GESTURE

CROSS-REFERENCE TO RELATED APPLICATIONS

This application is a Continuation of International Application No. PCT/EP2014/060549, filed on May 22, 2014, which claims benefit under 35 U.S.C. § 119(e) to U.S. Provisional Application No. 61/827,108, filed May 24, 2013. The disclosures of both related applications are considered part of and are incorporated by reference into the disclosure of the present application in their respective entireties.

FIELD OF THE INVENTION

The invention relates to a switch operating device, a mobile device with the switch operating device and a method for operating the switch with the switch operating device by a non-tactile push-gesture, in particular from a human hand.

BACKGROUND

Interactive systems and their human being-machine-interfaces are known for the human being-computer-interaction, wherein the human being-machine-interfaces are provided with a device for the automatic recognition of non-tactile or tactile gestures performed by human beings. The gesture can principally be derived from every posture and every movement of the body, wherein hand gestures have most importance. The gesture recognition device is provided with a device for the optical acquisition in particular of the gesticulating hand, wherein the image information generated thereby is processed with corresponding algorithms in order to derive a gesture out of the image information. The device for the optical acquisition of a non-tactile gesture is conventionally a camera that disadvantageously takes a large space and has high investment costs. Camera-based devices for the gesture recognition in miniaturized design with low costs, which would be for example advantageous for the use in mobile phones, are therefore not to be realized. Furthermore, camera-based devices have disadvantageously a high energy consumption, whereby mobile applications can only be realized with difficulty. High-speed spectrometers are alternatively known, which cannot provide remedy with respect to the miniaturized design with low costs. Touch screens in particular for mobile telephones are furthermore known, however the touch screens are suitable only for the recognition of tactile gestures and not for the recognition of non-tactile gestures.

SUMMARY

It is an object of the invention to provide a switch operating device, a mobile device with the switch operating device and a method for operating a switch with the switch operating device by a non-tactile push-gesture, wherein the switch operating device has a miniaturized design with low costs and low energy consumption and the operation of the switch with the switch operating device is secure and has few errors.

The switch operating device according to the invention comprises a gesture sensor for operating a switch by a non-tactile push-gesture that is to be performed with a part emitting heat and is formed by an approach phase during which the part approaches the gesture sensor, a waiting phase during which the part remains in the proximity of the gesture sensor, and a withdrawal phase during which the part is to be moved away from the gesture sensor, wherein the gesture sensor is adapted to detect heat emitted by the part with at least one pixel comprising a thin film out of pyroelectric material and to output per pixel a signal with signal deflections corresponding to the temporal intensity curve of the heat detected by the pixel during performing the gesture, a signal processing unit with which the performance of the gesture is determined from the temporal succession of the signal deflections, and an actuator that is controlled by the signal processing unit and operates the switch when the performance of the gesture is determined. The pyroelectric material is in particular lead-zirconate-titanate.

The mobile device according to the invention comprises the switch operating device, wherein the switch is interconnected in the mobile device for activation/deactivation of a functionality of the mobile device.

The method according to the invention for operating the switch operating device comprises: performing the non-tactile push-gesture with the part emitting heat, so that the signal deflection generated in the approach phase and the signal deflection generated in the withdrawal phase are output from the pixel to the signal processing unit, wherein a waiting level is reached by the signal between the signal deflections during the waiting phase, wherein the waiting level has a lower absolute value as the level of the signal deflections; monitoring the signal and identifying the occurrence of a succession of the signal deflections and the waiting level being temporally therebetween; when the succession is identified: controlling the actuator for operating the switch by the signal processing unit.

The alternative method according to the invention for operating the switch operating device comprises the steps: performing two immediate temporal consecutive non-tactile push-gestures with the part emitting heat during which the waiting phase lasts respectively zero seconds, so that a succession of signal deflections in shape of the signal deflection generated in the approach phase of the first push-gesture, the signal deflection generated in the withdrawal phase of the first push-gesture, the signal deflection generated in the approach phase of the second push-gesture and the signal deflection generated in the withdrawal phase of the second push-gesture is output from the pixel to the signal processing unit, wherein the signal deflections generated in the approach phases have another direction than the signal deflections generated in the withdrawal phases; monitoring the signal and identifying the occurrence of the succession of the signal deflections; as soon as the succession is identified: controlling the actuator for operating the switch by the signal processing unit.

Because the pixel comprises the thin film made out of the pyroelectric material, preferably lead-zirconate-titanate, the signal generated by the part emitting heat during performing the push-gesture is provided advantageously such that the recognition of the push-gesture with the method according to the invention can be carried out securely and has few errors. The gesture sensor with the pixel can furthermore be made in a miniaturized design with low costs such that the switch operating device can be advantageously used for mobile devices. The signal is generated with the thin film by the part emitting heat, so that the gesture sensor does not need to be supplied with energy by an external energy source. The switch operating device thus comprises the signal processing unit and the actuator as energy consumer, so that the energy consumption of the switch operating device is altogether advantageously low for the mobile device.

The gesture sensor preferably comprises at least two pixels. Therefore, two signals independently generated from each other are provided for the signal processing unit, wherein the processing of the signals and the gesture recognition coming along therewith is advantageously realized redundant.

The part is preferably a human hand and the heat emitted by the part is preferably the body heat radiated by the human hand. The recognition of the non-tactile push-gesture with the human hand is enabled particularly securely and has few errors resulting from the inventive and/or preferred embodiments of the switch operating device in the framework of usual human motion sequences.

The first alternative method according to the invention preferably comprises: verifying, if the temporal delay of the signal deflections is within a first predetermined duration; if the verification is positive, proceeding with the method. It is hereby preferred that the first predetermined duration is between 300 ms and 2000 ms. The first alternative method according to the invention furthermore preferably comprises: verifying, if the signal deflections have different directions; if the verification is positive, proceeding with the method. Further, it is preferred that the amplitude curve of the signal output by the pixel is used for the signal deflections. It is hereby preferred that it is verified, if the absolute value of the waiting level is maximum 20% of the absolute value of the signal level that prevails during a non-responding of the pixel. It is alternatively preferred that the first temporal derivative of the amplitude curve of the signal output by the pixel is used for the signal deflections. It is hereby preferred that it is verified, if the waiting level is maximum 20% of at least one of the absolute values of the signal level of the signal deflections. It is furthermore preferred that it is verified, if the waiting level is substantially zero.

For the second alternative method according to the invention it is preferred that a respective duration is arranged between the signal deflections of the succession, wherein the duration is within a predetermined time range. It is hereby preferred that the predetermined time range is from 100 ms to 1500 ms. Further, the second alternative method according to the invention preferably comprises: verifying, if the absolute values of the signal deflections are above a predetermined level; if the verification is positive, proceeding with the method. Further, it is preferred that the gesture sensor comprises at least two of the pixels and it is preferably verified, if the analogue signal deflections belonging to each other are respectively arranged within a second predetermined duration; if the verification is positive, proceeding with the method. It is hereby preferred that the second predetermined duration is 50 ms.

As it is supposed that the absolute value of the waiting level is maximum 20% of the absolute value of the signal level, it is advantageously achieved that noise that for example is released by influences out of the surroundings of the gesture sensor does not or at least barely affect the gesture processing, whereby the accuracy of the gesture recognition is increased.

By the inventive and/or preferred definition of the sequences of the signal deflections that are assigned to the push-gesture, the accuracy during recognition of the push-gesture out of arbitrate gestures is advantageously high, whereby a secure gesture recognition that has few errors is enabled. If, for example, the sequences of the signal deflections of a performed gesture do not correspond to the signal deflections of the push gesture, this gesture is not interpreted as a push-gesture. By using signal deflections generated by the thin film made out of the pyroelectric material, preferably lead-zirconate-titanate, for the identification of the push-gesture, an increase of the precision of the gesture recognition is surprisingly achieved.

BRIEF DESCRIPTION OF THE DRAWINGS

In the following a preferred embodiment of the invention is explained on the basis of schematic drawings, which show.

DETAILED DESCRIPTION

Figure 1:
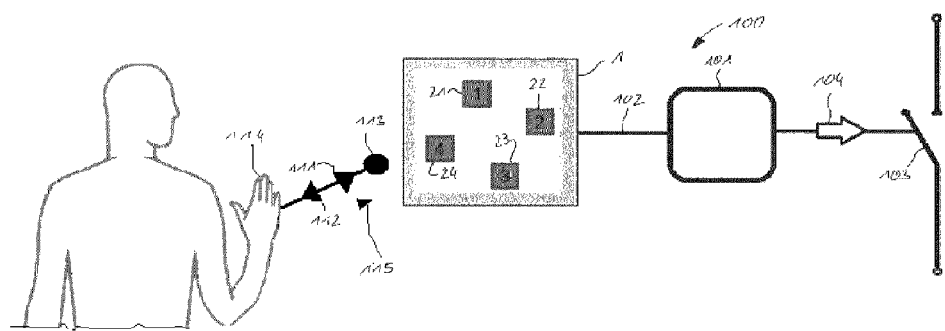
FIG. 1 a schematic illustration of a switch operating device according to the invention for a mobile device according to the invention, FIG. 2 a diagram with amplitude curves of signals of a gesture sensor from FIG. 1, FIG. 3 a diagram with the first temporal derivative of the amplitude curves from FIG. 2, FIG. 4 a detailed view of FIG. 2, and FIG. 5 a diagram with a rule for the formation of the first temporal derivative of the amplitude curves, as they are shown in FIG. 2.

A switch operating device 100 that is built in a mobile device is shown in FIG. 1. The switch operating device 100 comprises a gesture sensor 1 and a signal processing unit 101 that is coupled via a signal line 102 for transferring signals from the gesture sensor 1 to the signal processing unit 101. The signal processing unit 101 activates or deactivates an actuator 104, with which a switch 103 of the mobile device can be operated according to the processing of the signals that are transferred from the gesture sensor 1 to the signal processing unit 101. The switch 103 is interconnected in the mobile device for activating/deactivating a functionality of the mobile device.

The gesture sensor 1 is provided for detecting push-gestures, wherein, depending on if a push-gesture 115 was detected, a signal or a plurality of signals are transferred via the signal line 102 to the signal processing unit 101, on which basis the operation of the switch 103 via the actuator 104 is carried out. The operation of the switch 103 is only then triggered when the push-gesture 115 is identified by the gesture sensor 1 and by the signal processing unit 101.

The gestures are to be performed non-tactile with a hand 114 in the proximity of the gesture sensor 1, wherein heat emitted by the hand 114 can be detected by the gesture sensor 1. The push-gesture 115 is composed of the temporal immediate sequence of an approach phase 111, a waiting phase 113 and a withdrawal phase 112. During performing the push-gesture 115 the hand 114 is approached to the gesture sensor 101 during the approach phase 111 and after ending of the waiting phase 113, during which the hand 114 remains adjacent to the gesture sensor 1, is again withdrawn from the gesture sensor 1 during the withdrawal phase 112.

As an alternative or additionally it is provided that the switch 103 is operated with two temporally subsequently performed push-gestures that respectively consist only of the approach phase 111 and the withdrawal phase 112, wherein the waiting phase 113 is respectively zero seconds. That means that with these two push-gestures with the waiting phase 113 equaling zero seconds the hand 114 is approached to the gesture sensor 1, withdrawn, again approached and then again withdrawn without the hand 114 remaining in the proximity of the gesture sensor 1 a substantial duration. The signal processing unit 101 is adapted such that it identifies the push-gesture with the waiting phase 113 that lasts longer than zero seconds and/or two immediate consecutive push-gestures, which waiting phases 113 are respectively zero seconds.

The gesture sensor 1 comprises a first pixel 21, a second pixel 22, a third pixel 23 and a fourth pixel 24. The pixels 21 to 24 respectively comprise a thin film out of lead-zirconate-titanate with which the signal is respectively generated as soon as heat emitted by the hand 114 is detected by the respective pixel 21 to 24. The signal with a signal deflection corresponding the temporal intensity curve of the thin film of the corresponding pixel is therefore output from each pixel 21 to 24 to the signal processing unit 101 during performing the push-gesture 115 with the hand 114. The signal of the first pixel 21 is denoted with the reference sign 51, the signal of the second pixel 22 is denoted with the reference number 52, the signal of the third pixel 23 is denoted with the reference number 53, and the signal of the fourth pixel 24 is denoted with the reference sign 54.

Figure 2:
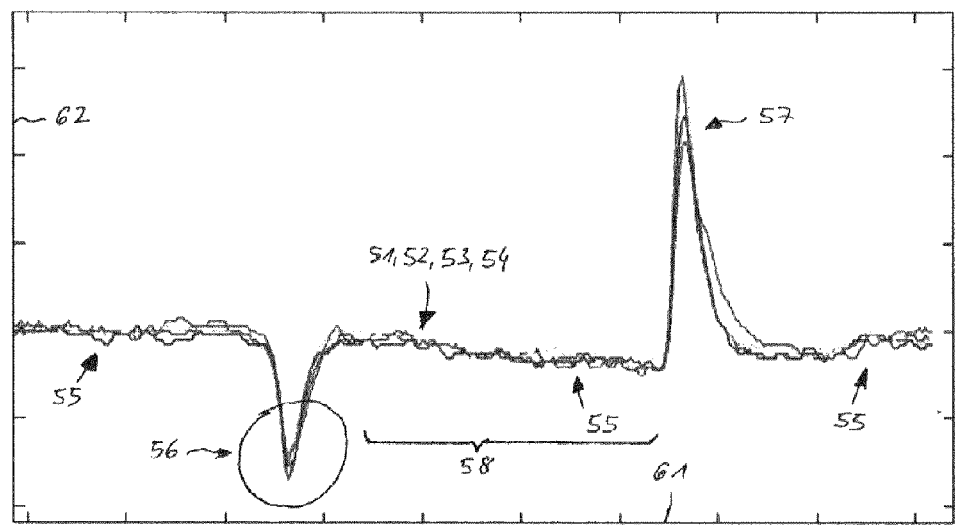

A diagram with the temporal amplitude curves of the signals output by the pixels 21 to 24 is shown in FIG. 2, wherein the time is plotted over the abscissa 61 and the amplitude is plotted over the ordinate 62. The signals 51 to 54 respectively comprise signal deflections 56, 57, wherein the signal deflections 56 are generated during the approach of the hand 114 to the gesture sensor 1 and the signal deflections 57 are generated during the withdrawal of the hand 114 from the gesture sensor 1. A waiting duration 58 is arranged between the signal deflections 56, 57, wherein the waiting duration 58 forms the waiting phase 113, whereas the signal deflections 56 form the approach phase 111 and the signal deflections 57 form the withdrawal phase 112. A signal level 55 during pixel passivity arises during the waiting phase 113, wherein the pixel passivity occurs when no heat emitted by the hand 114 is detected by the gesture sensor 1. The signal level 55 also arises in advance of the signal deflection 56 during approach and in the lag of the signal deflection 57 during withdrawal of the hand 114.

Figure 3:
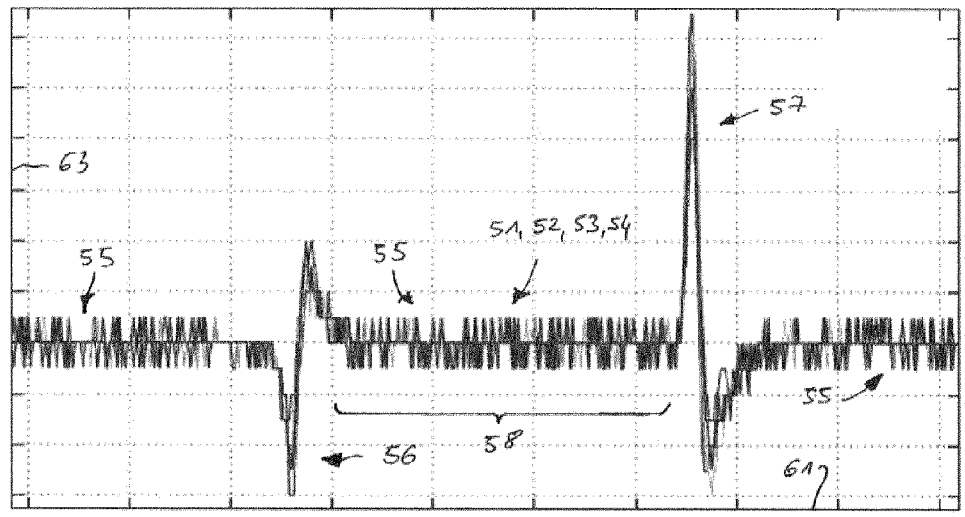
Figure 5:
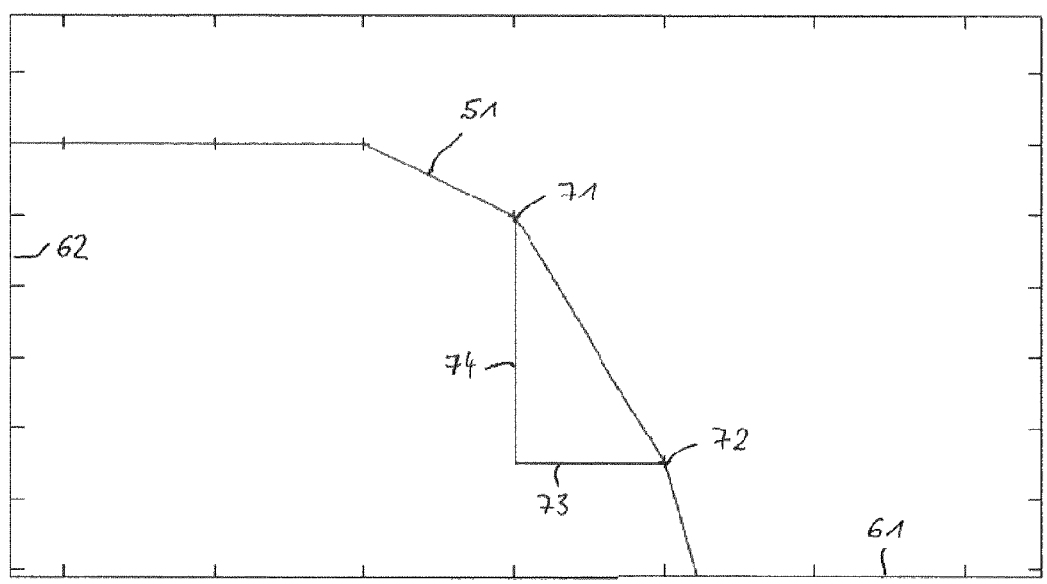

Alternatively to FIG. 2, in FIG. 3, the first temporal derivative of the amplitude curves plotted in FIG. 2 is illustrated over the ordinate 63. A representative detail of one of the signals 51 to 54 is shown in FIG. 5, wherein the amplitude of this signal is plotted versus the time. The amplitude curve is in particular formed by a first sampling point 71, a second sampling point 72, wherein the sampling points 71 and 72 are temporally shifted to each other by a time increment 73 and an amplitude difference 74 is formed between the sampling points 71 and 72. The temporal derivative is to be formed discrete by a quotient out of the amplitude difference 74 and the time increment 73.

Figure 4:
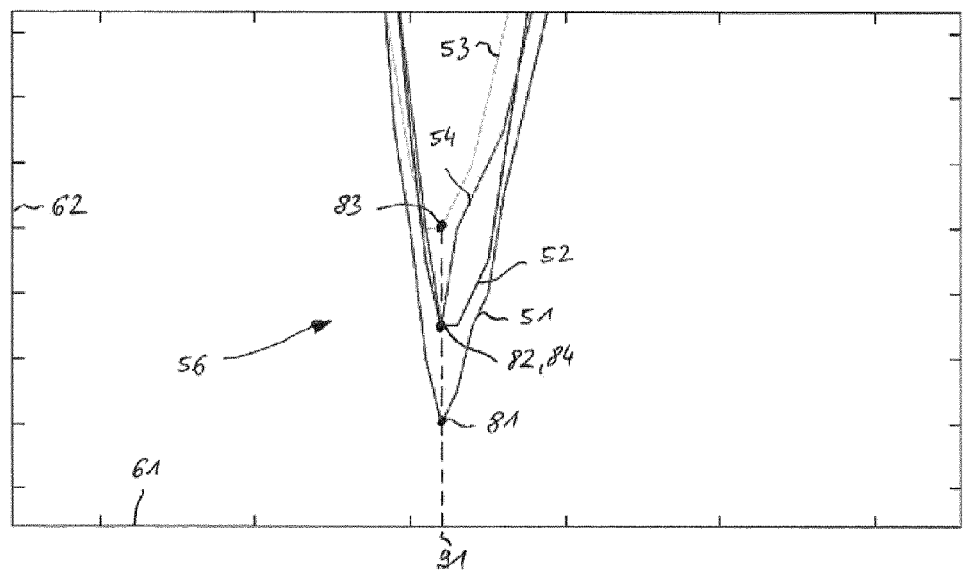

A detail of FIG. 2 is shown in FIG. 4, wherein the signal deflection 56 during approach of the hand 114 to the gesture sensor 1 is illustrated magnified. The curves of the amplitudes of the signals 51 to 54 are shown, wherein each of the amplitude curves comprises a minimum 81 to 84. The signals 51 to 54 are generated by the push-gesture 115 according to the first alternative. The four pixels 21 to 24 are simultaneously affected during performing of the push-gesture 115. The qualitative curve the signals 51 to 54 is therefore simultaneous so that the minima 81 to 84 occur simultaneously in the point of time 91. The push-gesture 115 is performed such that the hand 114 is moved towards the gesture sensor 1 during the approach phase 111, remains in the proximity of the gesture sensor 1 during the waiting phase 113 the waiting duration 58 and is again subsequently withdrawn from the gesture sensor 1 during the withdrawal phase 112. The movement of the hand during the approach phase 111 and the withdrawal phase 112 is supposed to be substantially perpendicular to the plane defined by the pixels 21 to 24. The pixels 21 to 24 simultaneously detect the heat emitted by hand 114 during performing the push-gesture 115.

Arbitrary gestures can be performed by the hand 114 during the operation of the switch operating device 100. However, it is so provided that only during performing the push-gesture 115 the switch 103 is supposed to be operated. Therefore, it is to identify the presence of the push-gesture 115 out of a plurality of possible gestures and noise influences out of the surroundings of the switch operating device 100.

The signals 51 to 54 are transferred from the gesture sensor 1 to the signal processing unit 101 for the identification of the performed gesture. It is verified in the signal processing unit 101 if the signals 51 to 54 comprise the signal deflections 56 and 57, wherein the waiting level 55 is supposed to be present between the signal deflections 56 and 57 during the phase 113. Further, it is verified in the signal processing unit 101 if the temporal delay of the signal deflections 56 and 57 is within a first predetermined duration that can be chosen between 300 ms and 2000 ms. It is furthermore verified in the signal processing unit 101 if the signal deflections 56 and 57 have different directions. That means, it is verified if the signal deflection 56 has a lower level than the waiting level 55 and the signal deflection 57 has a higher level than the waiting level 55, respectively if the signal deflection 56 has a higher level than the waiting level 55 and the signal deflection 57 has a lower level than the waiting level 55. It is additionally verified in the signal processing unit 101 if the absolute value of the waiting level 55 is maximum 20% of the absolute value of the signal level that prevails during a non-affection of the pixel. In FIG. 2 the signal level during a non-affection of the pixel 21 to 24 is equalized with the signal level 25 during pixel passivity.

In case the verifications in the signal processing unit 101 result in that the criteria mentioned earlier are fulfilled, the gesture detected by the gesture sensor is identified as the push-gesture 115. According to how it is stored in the signal processing unit 101, the switch 103 is operated via the actuator 104. Gestures that are not identified as the push-gesture 115 are rejected in the signal processing unit 101. Every arbitrary combination of the verifications in every arbitrary sequence is principally conceivable.

The signal processing unit 101 is alternatively configured such that two immediate temporal consecutive push-gestures trigger the operation of the switch 103 by the actuator 104. The two immediate temporal consecutive push-gestures have respectively a waiting phase 113 that lasts zero seconds. A sequence of signal deflections in shape of the signal deflection 56 generated in the approach phase 111 of the first push-gesture, the signal deflection 57 generated in the withdrawal phase 112 of the first push-gesture, a signal deflection generated in the approach phase of the second push-gesture, and a signal deflection generated in the withdrawal phase of the second push-gesture therefore results. The signal deflections generated in the approach phases have another direction as the signal deflections generated in the withdrawal phases. The switch 103 is then operated by the signal processing unit 101 via the actuator 104, when a respective duration from 100 ms to 1500 ms is between the single signal deflections of the succession and if the signal deflections belonging to each other are respectively within a duration of 50 ms. Every arbitrary combination of the verifications in every arbitrary sequence is principally conceivable.

LIST OF REFERENCE SIGNS 1 gesture sensor
21 first pixel
22 second pixel
23 third pixel
24 fourth pixel
51 signal of the first pixel
52 signal of the second pixel
53 signal of the third pixel
54 signal of the fourth pixel
55 signal level during pixel passivity
56 signal deflection during approach
57 signal deflection during withdrawal
58 waiting duration
61 abscissa: time
62 ordinate: amplitude
63 ordinate: first derivative of the amplitude
71 first sampling point
72 second sampling point
73 time increment
74 amplitude difference
81 first minimum
82 second minimum
83 third minimum
84 fourth minimum
91 point in time
100 switch operating device
101 signal processing unit
102 signal line
103 switch
104 actuator
111 approach phase
112 withdrawal phase
113 waiting phase
114 hand
115 push-gesture

What is claimed is:

1. A switch operating device comprising:
a gesture sensor adapted to operate a switch in response to performance of a non-tactile push-gesture that is performed with a heat emitting part, wherein the gesture includes an approach phase, during which the part approaches the gesture sensor, followed by a waiting phase during which the part remains in proximity of the gesture sensor, followed by a withdrawal phase, during which the part is moved away from the gesture sensor, wherein the gesture sensor is adapted to detect heat emitted by the part with at least one pixel comprising a thin film that comprises pyroelectric material and to output per pixel a signal with signal deflections indicative of a temporal intensity curve of the heat detected by the pixel in response to the performance of the gesture,
a signal processing unit with which the performance of the gesture is determined from a temporal succession of the signal deflections, and
an actuator controlled by the signal processing unit and adapted to operate the switch when the performance of the gesture is determined.

2. The switch operating device according to claim 1, wherein the pyroelectric material is lead-zirconate-titante.

3. The switch operating device according to claim 1, wherein the gesture sensor comprises at least one further pixel.

4. The switch operating device according to claim 1, wherein the part is a human hand and the heat emitted by the part is body heat radiated by the human hand.

5. A mobile device having a switch operating device according to claim 1, wherein the switch is interconnected in the mobile device to alternately activate and deactivate a functionality of the mobile device.

6. A method for operating a switch operating device according to claim 1, comprising:
outputting the signal deflection generated in the approach phase and the signal deflection generated in the withdrawal phase from the pixel to the signal processing unit in response to the performance of the non-tactile push-gesture with the heat emitting part, wherein a waiting level that has a lower absolute value than the level of the signal deflections is reached by the signal during the waiting phase;
monitoring the signal and identifying an occurrence of the succession of the signal deflections and the waiting level temporally therebetween;
controlling the actuator to operate the switch via the signal processing unit when the succession is identified.

7. The method according to claim 6, further comprising:
proceeding with the method if a temporal delay of the signal deflections is within a first predetermined duration.

8. The method according to claim 7, wherein the first predetermined duration is between 300 ms and 2000 ms.

9. The method according to claim 6, further comprising:
proceeding with the method if the signal deflections have differing directions.

10. The method according to claim 6, wherein an amplitude curve of the signal output by the pixel is used for the signal deflections.

11. The method according to claim 10, further comprising:
verifying whether the absolute value of the waiting level is at most 20% of the absolute value of the signal level that prevails during a non-responding of the pixel.

12. The method according to claim 6, wherein the first temporal derivative of an amplitude curve of the signal output by the pixel is used for the signal deflections.

13. The method according to claim 12, further comprising:
verifying whether the waiting level is at most 20% of at least one of the absolute values of the signal level of the signal deflections.

14. The method according to claim 12, with the step:
verifying whether the waiting level is substantially zero.

15. A method for operating a switch operating device according to claim 1, comprising:
outputting a succession of the signal deflections in shape of the signal deflection generated in the approach phase of the first push-gesture, the signal deflection generated in the withdrawal phase of the first push-gesture, the signal deflection generated in the approach phase of the second push-gesture, and the signal deflection generated in the withdrawal phase of the second push-gesture from the pixel to the signal processing unit in response to performance of two immediate temporal consecutive non-tactile push-gestures with the heat emitting part during which the waiting phase lasts respectively zero seconds, wherein the signal deflections generated in the approach phases have another direction than the signal deflections generated in the withdrawal phases;

monitoring the signal and identifying an occurrence of the succession of the signal deflections;

controlling the actuator to operate the switch via the signal processing unit when the succession is identified.

16. The method according to claim 15, wherein a respective duration is arranged between the signal deflections of the succession, wherein the duration is within a predetermined time range.

17. The method according to claim 15, wherein the predetermined time range is from 100 ms to 1500 ms.

18. The method according to claim 6, further comprising:
proceeding with the method if absolute values of the signal deflections are above a predetermined level.

19. The method according to claim 6, wherein the gesture sensor comprises at least one further pixel, further comprising:
proceeding with the method if the mutually associated analogue signal deflections are respectively arranged within a second predetermined duration.

20. The method according to claim 19, wherein the second predetermined duration is 50 ms.

* * * * *